(12) United States Patent
Jen et al.

(10) Patent No.: US 9,805,934 B2
(45) Date of Patent: Oct. 31, 2017

(54) FORMATION OF CONTACT/VIA HOLE WITH SELF-ALIGNMENT

(71) Applicant: TAIWAN SEMICONDUCTOR MANUFACTURING CO., LTD., Hsinchu (TW)

(72) Inventors: Chi-Chung Jen, Kaohsiung (TW); Yu-Hua Yen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/081,894

(22) Filed: Nov. 15, 2013

(65) Prior Publication Data
US 2015/0140796 A1 May 21, 2015

(51) Int. Cl.
*H01L 21/3205* (2006.01)
*H01L 21/28* (2006.01)
*H01L 21/311* (2006.01)
*H01L 21/768* (2006.01)

(52) U.S. Cl.
CPC .. *H01L 21/28008* (2013.01); *H01L 21/31116* (2013.01); *H01L 21/31144* (2013.01); *H01L 21/76816* (2013.01); *H01L 21/76897* (2013.01); *H01L 2221/1063* (2013.01)

(58) Field of Classification Search
None
See application file for complete search history.

(56) References Cited

U.S. PATENT DOCUMENTS

| | | | | |
|---|---|---|---|---|
| 5,482,886 A | * | 1/1996 | Park et al. | 438/397 |
| 5,661,053 A | * | 8/1997 | Yuan | 438/257 |
| 5,858,829 A | * | 1/1999 | Chen | 438/238 |
| 5,882,983 A | * | 3/1999 | Gardner et al. | 438/424 |
| 5,981,333 A | * | 11/1999 | Parekh | H01L 27/10852 257/E21.013 |
| 6,008,513 A | * | 12/1999 | Chen | 257/296 |
| 6,015,983 A | * | 1/2000 | Parekh | H01L 27/10817 257/296 |
| 6,238,971 B1 | * | 5/2001 | Parekh | H01L 27/10888 257/E21.013 |
| 6,359,302 B1 | * | 3/2002 | Parekh | H01L 28/91 257/303 |
| 6,440,847 B1 | * | 8/2002 | Lou | 438/639 |
| 6,744,664 B1 | * | 6/2004 | Wu | 365/185.03 |
| 7,615,445 B2 | * | 11/2009 | Chien et al. | 438/257 |
| 7,808,042 B2 | * | 10/2010 | Juengling | 257/331 |
| 7,910,434 B2 | * | 3/2011 | Chien et al. | 438/257 |
| 7,969,776 B2 | * | 6/2011 | Juengling | 365/174 |
| 7,981,736 B2 | * | 7/2011 | Juengling | 438/157 |
| 8,076,229 B2 | * | 12/2011 | Juengling | 438/585 |
| 8,148,776 B2 | * | 4/2012 | Juengling | 257/331 |
| 8,288,225 B2 | * | 10/2012 | Chien et al. | 438/257 |
| 8,450,785 B2 | * | 5/2013 | Juengling | 257/306 |

(Continued)

*Primary Examiner* — David E Graybill
(74) *Attorney, Agent, or Firm* — McDermott Will & Emery LLP

(57) ABSTRACT

In a method for manufacturing a semiconductor device, a substrate is provided, and a dielectric layer is formed to cover the substrate. A recess portion is formed in the dielectric layer. A spacer is formed on a side surface of the recess portion. The dielectric layer is etched through the recess portion to form a hole in the dielectric layer to expose a portion of the substrate.

20 Claims, 5 Drawing Sheets

(56) References Cited

U.S. PATENT DOCUMENTS

| | | | |
|---|---|---|---|
| 8,546,876 B2* | 10/2013 | Juengling | 257/331 |
| 8,759,889 B2* | 6/2014 | Juengling | 257/296 |
| 8,810,310 B2* | 8/2014 | Juengling | 327/566 |
| 8,846,513 B2* | 9/2014 | Baars et al. | 438/586 |
| 8,866,254 B2* | 10/2014 | Juengling | 257/506 |
| 2008/0076217 A1* | 3/2008 | Chien et al. | 438/257 |
| 2010/0047979 A1* | 2/2010 | Chien et al. | 438/257 |
| 2011/0111583 A1* | 5/2011 | Chien et al. | 438/589 |
| 2013/0075821 A1* | 3/2013 | Baars et al. | 257/368 |
| 2015/0140796 A1* | 5/2015 | Jen | H01L 21/28008 438/585 |

* cited by examiner

FORMATION OF CONTACT/VIA HOLE WITH SELF-ALIGNMENT

BACKGROUND

Description of Related Art

In a semiconductor device, a contact hole or a via hole can be used to form an interconnection between devices in an integrated circuit. As semiconductor devices continue to be scaled down, an interval between adjacent devices is increasingly shrunk. Accordingly, it is more and more difficult to provide electrical connection between the devices.

For example, as the adjacent devices are getting closer, a process window of a contact hole in a contact to polysilicon process for critical dimension (CD) and overlay becomes smaller. Thus, sidewall spacers of the adjacent devices are easily damaged during a dry etching operation of the contact hole.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1A:
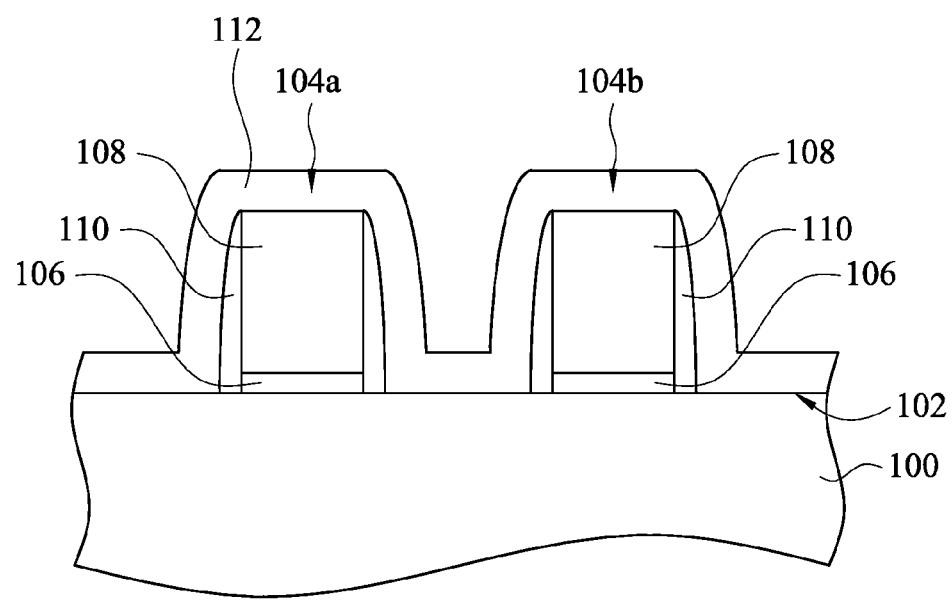
FIG. 1A through FIG. 1E are schematic cross-sectional views of intermediate stages showing a method for manufacturing a semiconductor device in accordance with various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a conventional process for forming a contact hole or a via hole of a semiconductor device, a dielectric layer is formed to cover devices above a substrate, a patterned photoresist layer including a pattern of the contact hole or the via hole is formed on the dielectric layer, and the dielectric layer is etched to form the contact hole or the via hole by using the patterned photoresist layer as a mask. Therefore, the size of the hole is limited due to the limitation of photolithography. As semiconductor devices keep shrinking, it is more and more difficult to form contact holes or via holes for providing electrical connections between the semiconductor devices.

Embodiments of the present disclosure are directed to providing a method for forming a contact hole or a via hole. The method is performed to form the contact hole or the via hole having a small bottom by using a self-alignment process. In the method, a recess portion is formed in a dielectric layer where a contact hole or a via hole is to be formed, and a spacer is formed on a side surface of the recess portion to shrink a bottom of the recess portion. Thus, when the dielectric layer is etched through the recess portion, a hole having a small bottom is formed with the assistance of the spacer.

Referring to FIG. 1A through FIG. 1E, FIG. 1A through FIG. 1E are schematic cross-sectional views of intermediate stages showing a method for manufacturing a semiconductor device in accordance with various embodiments. The method can be used to manufacture a hole, such as a contact hole or a via hole having a small bottom, of a semiconductor device. As shown in FIG. 1A, a substrate 100 is provided. The substrate 100 is a semiconductor substrate. The substrate 100 is composed of a single-crystalline semiconductor material or a compound semiconductor material. For example, the substrate 100 is a silicon substrate. In some embodiments, carbon, germanium, gallium, arsenic, nitrogen, indium, phosphorus, and/or the like, is also used as a material of the substrate 100.

In some embodiments, when the substrate 100 is provided, at least two devices 104a and 104b have been formed on a surface 102 of the substrate 100. In some exemplary examples, each of the devices 104a and 104b includes a gate structure, i.e. the operation of forming the devices 104a and 104b includes forming two gate structures. Each of the devices 104a and 104b includes a gate dielectric layer 106, a gate 108 and a gate spacer 110. In each of the devices 104a and 104b, the gate dielectric layer 106 is disposed on the surface 102 of the substrate 100, the gate 108 is formed stacked on the gate dielectric layer 106, and the gate spacer is formed on sidewalls of the gate dielectric layer 106 and the gate 108. In certain embodiments, as shown in FIG. 1A, an etch stop layer 112 is optionally formed to cover the devices 104a and 104b and the surface 102 of the substrate 100. During the subsequent etching process, the etching process can be stopped by the etch stop layer 112, thereby preventing the devices 104a and 104b from being damaged by etching.

In some embodiments, a dielectric layer 114 is deposited to cover the surface 102 of the substrate 100. For example, the dielectric layer 114 is formed by using a chemical vapor deposition (CVD) technique, such as a plasma enhanced CVD (PECVD) technique. In the embodiment including the devices 104a and 104b and the etch stop layer 112 formed on the surface 102 of the substrate 100, the dielectric layer 114 is formed to cover the etch stop layer 112. The etch stop layer 112 is used to provide a stop for preventing the devices 104a and 104b from being damaged during the subsequent etching process, so that the etch stop layer 112 and the dielectric layer 114 are formed from different materials. For example, the etch stop layer 112 is formed from silicon nitride or silicon oxynitride, and the dielectric layer 114 is formed from silicon oxide.

Figure 1B:
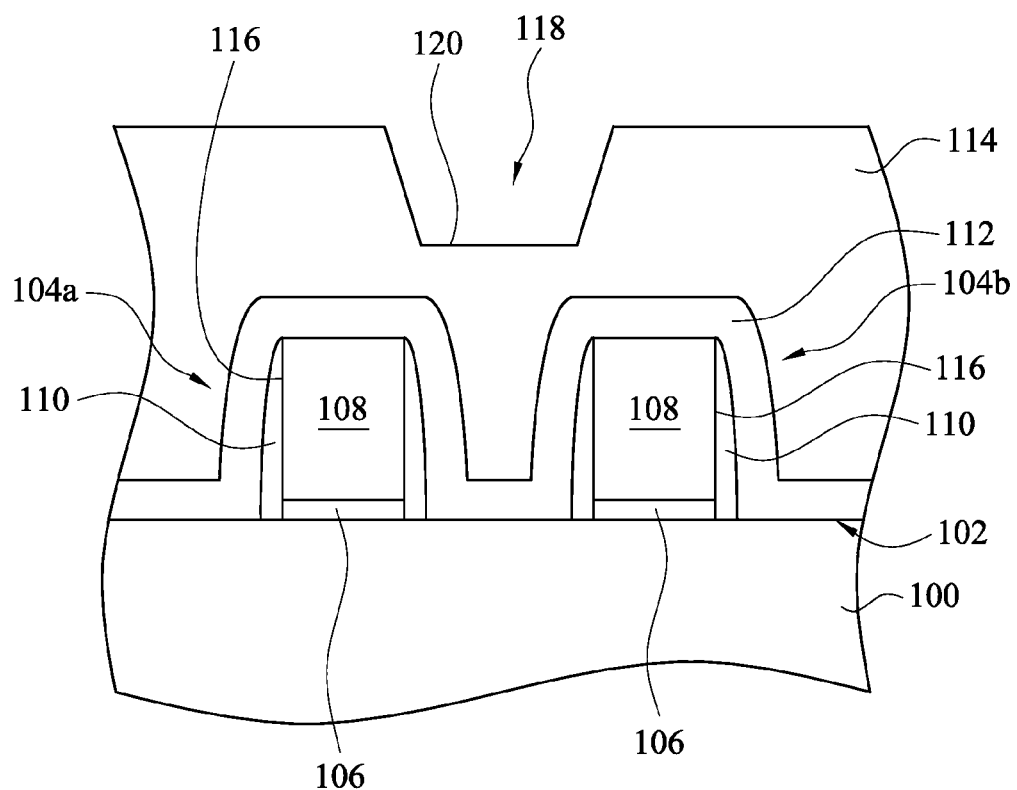

After the dielectric layer 114 is formed, a recess portion 118 is formed on the dielectric layer 114 where a hole is to be formed, as shown in FIG. 1B. In some embodiments, the recess portion 118 is formed by etching the dielectric layer 114. For example, a dry etching process is used to etch a portion of the dielectric layer 114 to form the recess portion 118 in the dielectric layer 114. In the embodiments, such as shown in FIG. 1B, the hole is to be formed between the devices 104a and 104b, so that the recess portion 118 is formed between the devices 104a and 104b, and the recess portion 118 is located above the devices 104a and 104b, i.e. a bottom 120 of the surface 118 is located above tops of the devices 104a and 104b.

Figure 1C:
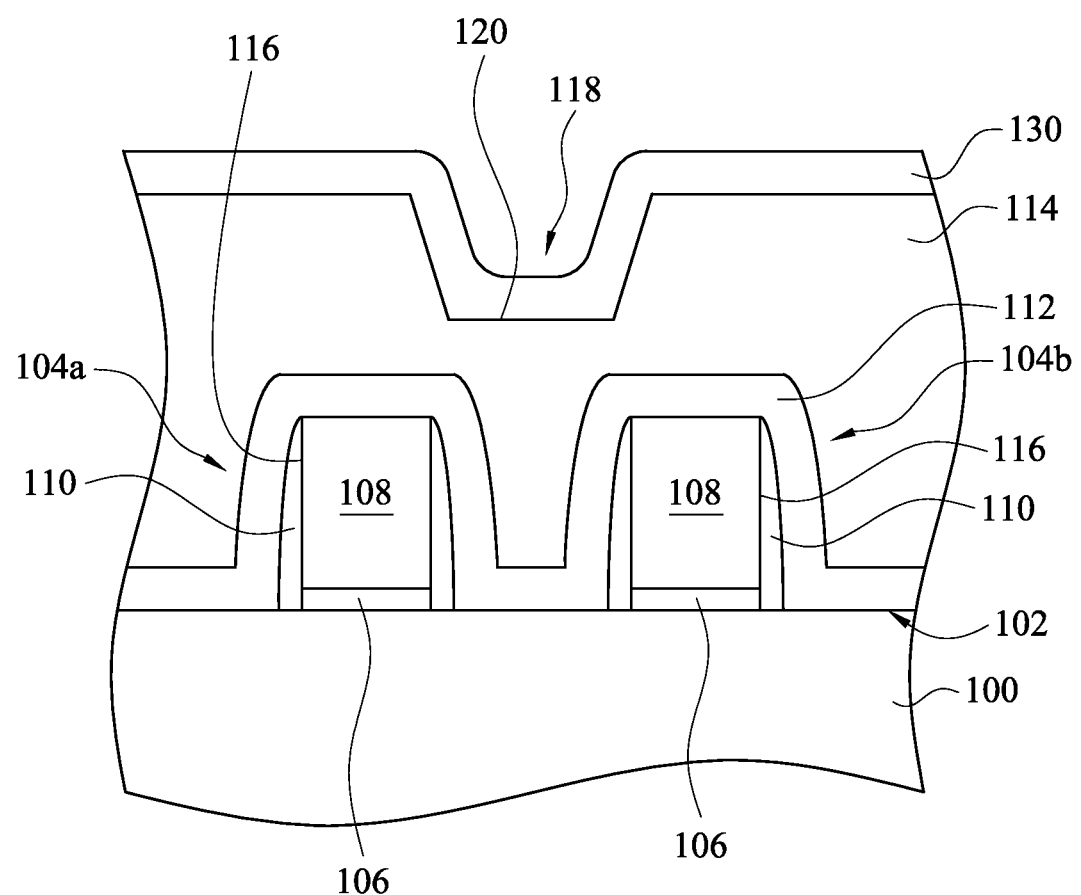
Figure 1D:
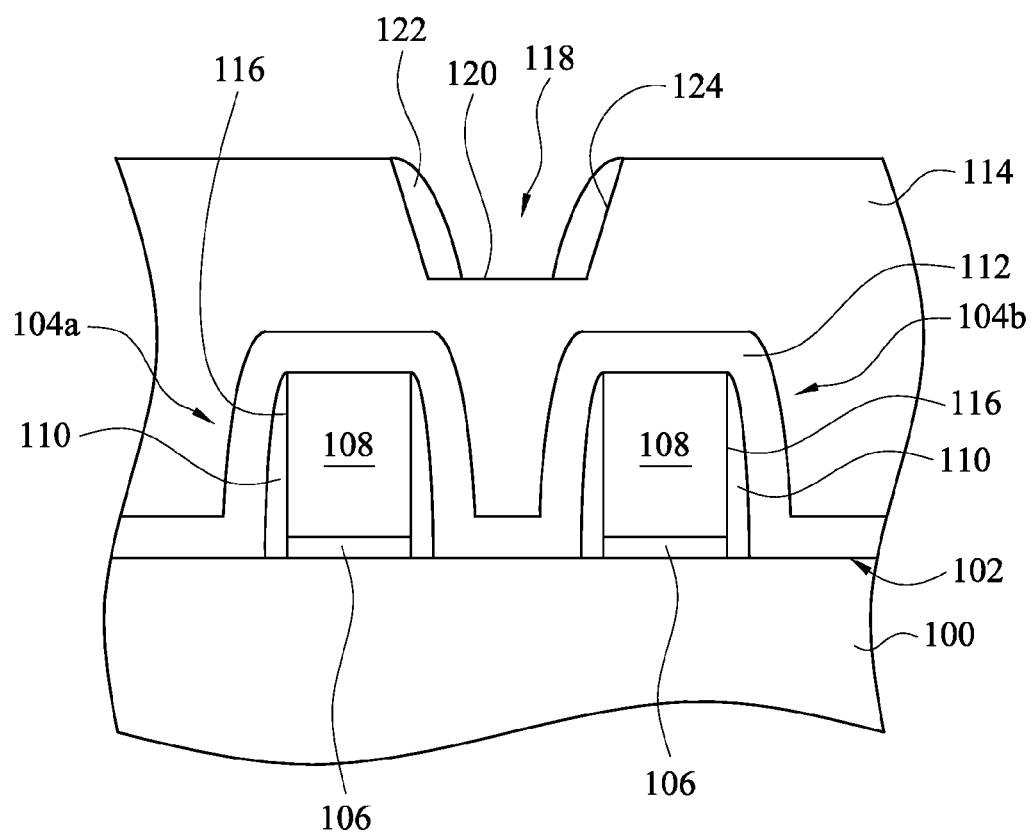

As shown in FIG. 1D, a spacer 122 is formed on a side surface 124 of the recess portion 118. The spacer 122 occupies a portion of the bottom 120 of the recess portion 118 adjacent to the side surface 124, so that the existence of the spacer 122 can shrink the bottom 120 of the recess portion 118. In various embodiments, in the fabrication of the spacer 122, as shown in FIG. 1C, a blanket dielectric layer 130 is formed on the dielectric layer 114 including the recess portion 118 by using a deposition method. For example, the blanket dielectric layer 130 is formed by using a CVD method. After the blanket dielectric layer 130 is formed, an anisotropically etching operation is performed on the blanket dielectric layer 130 to remove a portion of the blanket dielectric layer 130 until the bottom 120 of the recess portion 118 is exposed. After anisotropically etching, the spacer 122 is formed on the side surface 124 of the recess portion 124. As shown in FIG. 1D, the spacer 122 is also located on a portion of the bottom 120 of the recess portion 118 near the side surface 124. Thus, the bottom 120 of the recess portion 118 is narrowed by the spacer 122.

In some embodiments, the spacer 122 and the etch stop layer 112 are formed from different materials. In certain embodiments, the spacer 122 and the etch stop layer 112 are formed from the same material for benefiting to the subsequent etching operation. Furthermore, the spacer 122 and the dielectric layer 114 are formed from different materials. For example, the dielectric layer is formed from silicon oxide, and the spacer 122 and the etch stop layer are formed from silicon nitride or silicon oxynitride.

Figure 1E:
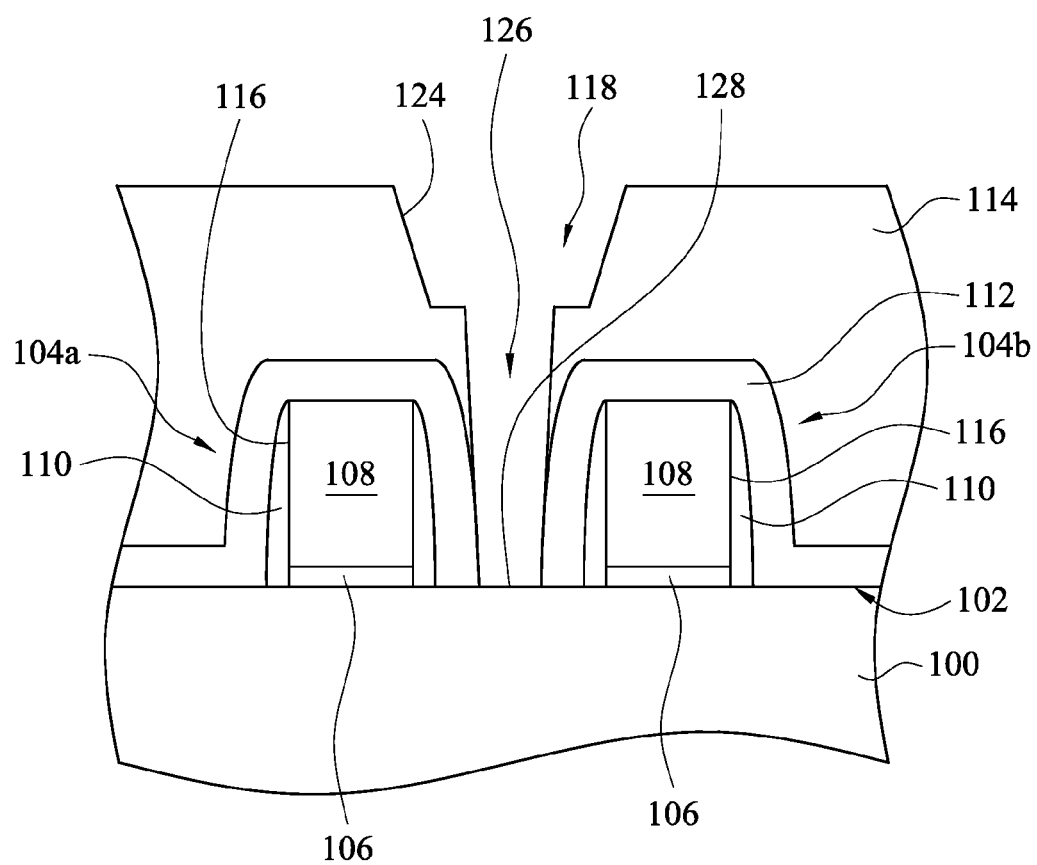

After the spacer 122 is formed, the dielectric layer 114 can be etched through the exposed bottom 120 of the recess portion 118 to form a hole 126 in the dielectric layer 114 by using a self-alignment process. The dielectric layer 114 is etched until a portion of the surface 102 of the substrate 100 is exposed. That is, a bottom 128 of the hole 126 exposes the portion of the surface 102 of the substrate 100, as shown in FIG. 1E. In some embodiments, the dielectric layer 114 is etched by using a dry etching method. In the embodiments, such as shown in FIG. 1E, the hole 126 is formed between the devices 104a and 104b, and the hole 126 is referred to as a contact hole where a contact is to be formed.

In various embodiments, the method is used to form a via hole in the dielectric layer 114. In such embodiments, the recess portion 118 is formed in the dielectric layer 114 above one device or an electrical connection, the spacer 122 is formed on the side surface 124 of the recess portion 118 to cover a portion of the bottom 120 of the recess portion 118, and the dielectric layer 114 is etched through the exposed portion of the bottom 120 of the recess portion 118 by using a self-alignment process so as to form the via hole including a bottom exposing a portion of a top of the device or a portion of the electrical connection.

In some embodiments, in the operation of etching the dielectric layer 114 through the recess portion 118 including the spacer 122 formed therein, two etching operations are used. Firstly, a first etching operation is performed to etch the dielectric layer 114 exposed by the recess portion 118 until the etch stop layer 112 is exposed. Then, an etch recipe used in the first etching operation is modified, and a second etching operation is performed with the modified etch recipe to etch the spacer 122 and the exposed etch stop layer 112 until a portion of the surface 102 of the substrate 100 is exposed so as to complete the fabrication of the hole 126. In such embodiments, the spacer 122 and the etch stop layer 112 are formed form the same material or different materials with similar etch properties.

By applying a two-stage etching process onto the dielectric layer 114 to form the recess portion 118 and the hole 126 in the dielectric layer 114 in sequence, and forming the spacer 122 on the side surface 124 of the recess portion 118 between the operations of forming the recess portion 118 and the hole 126, the bottom 120 of the recess portion 118 is narrowed, and the hole with the bottom 128 smaller than the bottom 120 of the recess portion 118 formed by using a photolithography technique is successfully formed. Thus, the process window of the hole 126 with a small critical dimension for overlay accuracy is enlarged, thus further preventing sidewalls of the devices 104a and 104b from being damaged while the dielectric layer 114 is etched to form the hole 126.

Figure 2:
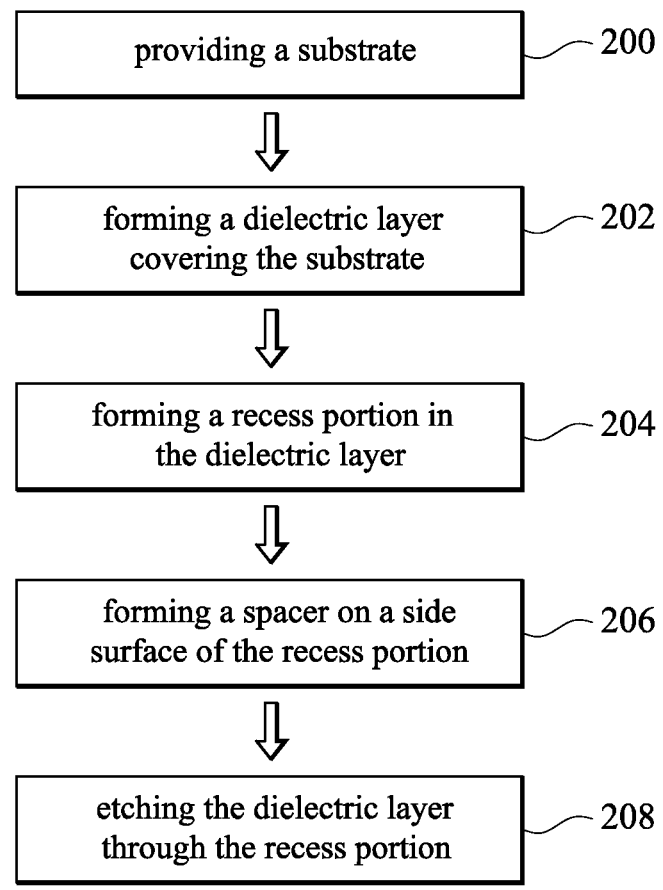
FIG. 2 is a flow chart of a method for forming a hole of a semiconductor device in accordance with various embodiments.

Referring to FIG. 2 with FIG. 1A through 1E, FIG. 2 is a flow chart of a method for manufacturing a hole of a semiconductor device in accordance with various embodiments. The method begins at operation 200, where a substrate 100 is provided. For example, the substrate 100 is a silicon substrate. In some embodiments, as shown in FIG. 1A, at least two devices 104a and 104b are formed on a surface 102 of the substrate 100. In certain embodiments, an etch stop layer 112 is formed to cover the devices 104a and 104b and the surface 102 of the substrate 100. At operation 202, a dielectric layer 114 is formed on the surface 102 of the substrate 100. In the embodiment which includes the devices 104a and 104b and the etch stop layer 112, the dielectric layer 114 is formed to cover the etch stop layer 112. The dielectric layer 114 and the etch stop layer 112 are formed from different materials.

At operation 204, as shown in FIG. 1B, a recess portion 118 is formed in the dielectric layer 114. In some embodiments, the recess portion 118 is formed in the dielectric layer 114 by etching the dielectric layer 114. For example, a dry etching process is used to remove a portion of the dielectric layer 114 so as to form the recess portion 118 in the desired region of the dielectric layer 114. In the embodiment of forming a contact hole in the dielectric layer 114, the recess portion 118 is formed between the devices 104a and 104b, and the recess portion 118 is located above the devices 104a and 104b.

At operation 206, as shown in FIG. 1D, a spacer 122 is formed on a side surface 124 and a portion of a bottom of the recess portion 118. In some embodiments, the spacer 122 and the dielectric layer 114 are formed from different materials. In some exemplary examples, in the fabrication of the spacer 122, a blanket dielectric layer 130 is formed to cover the dielectric layer 114, as shown in FIG. 1C. Then, the blanket dielectric layer 130 is anisotropically etched until the bottom 120 of the recess portion 118 is exposed so to form the spacer 122 within the recess portion 118, as shown in FIG. 1D.

At operation 208, by using the spacer 122 as a mask, the dielectric layer 114 is etched through the exposed bottom 120 of the recess portion 118 to form a hole 126 in the dielectric layer 114. In the embodiment including the etch stop layer 112, the dielectric layer 114 is firstly etched through the recess portion 118 until the etch stop layer 112 is exposed, and the spacer 122 and the exposed etch stop layer 112 are then etched until the surface 102 of the substrate 100 is exposed so as to complete the fabrication of the hole 126.

In accordance with an embodiment, the present disclosure discloses a method for manufacturing a semiconductor device. In this method, a substrate is provided. A dielectric layer is formed covering the substrate. A recess portion is formed in the dielectric layer. A spacer is formed on a side surface of the recess portion. The dielectric layer is etched through the recess portion to form a hole in the dielectric layer to expose a portion of the substrate.

In accordance with another embodiment, the present disclosure discloses a method for manufacturing a semiconductor device. In this method, a substrate is provided, on which at least two devices and an etch stop layer covering the devices are formed. A dielectric layer is formed covering the etch stop layer. A recess portion is formed in the dielectric layer, in which the recess portion is located between and above the devices. A spacer is formed on a side surface of the recess portion. The dielectric layer is etched through the recess portion to form a hole between the devices to expose a portion of the substrate.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor device, the method comprising:
   providing a substrate;
   forming a first dielectric layer covering the substrate;
   performing a first stage etching operation on a top surface of the first dielectric layer to form a recess portion in the first dielectric layer;
   forming a second dielectric layer to cover and directly physically contact the top surface of the first dielectric layer and a side surface and a bottom of the recess portion;
   removing a portion of the second dielectric layer to immediately expose the top surface of the first dielectric layer and a portion of the bottom of the recess portion to form a dielectric spacer on the side surface of the recess portion;
   after forming the dielectric spacer on the side surface of the recess portion, performing a second stage etching operation on the first dielectric layer through the recess portion to form a hole in the first dielectric layer, wherein the hole extends from the top surface of the first dielectric layer to a bottom surface of the first dielectric layer; and
   removing the dielectric spacer to generate a via hole having a step-profile with a wider opening; and
   filling the via hole with a conductive material through the wider opening to form a via/contact connector.

2. The method of claim 1, the method further comprising:
   forming at least two devices on the substrate; and
   forming an etch stop layer to cover the devices and the substrate,
   wherein forming the first dielectric layer comprises forming the first dielectric layer to cover the etch stop layer.

3. The method of claim 2, wherein the first stage etching operation comprises forming the recess portion between and above the devices.

4. The method of claim 2, wherein the second stage etching operation comprises forming the hole through the first dielectric layer and the etch stop layer to expose a portion of a top surface of the substrate, and said portion of the top surface of the substrate exposed by the hole is between the devices.

5. The method of claim 2, wherein forming the devices comprises forming at least two gate structures.

6. The method of claim 2, wherein forming the second dielectric layer and forming the etch stop layer are performed using different materials.

7. The method of claim 2, wherein forming the second dielectric layer and forming the etch stop layer are performed using the same material.

8. The method of claim 7, wherein the second stage etching operation comprises etching the etch stop layer exposed by the hole in the first dielectric layer until the substrate is exposed.

9. The method of claim 1, wherein the second stage etching operation comprises using a dry etching method to etch the first dielectric layer.

10. The method of claim 1, wherein forming the second dielectric layer and forming the first dielectric layer are performed using different materials.

11. A method for manufacturing a semiconductor device, the method comprising:
    providing a substrate on which at least two devices and an etch stop layer covering the devices are formed;
    forming a first dielectric layer covering the etch stop layer;
    performing a first stage etching operation on a top surface of the first dielectric layer to form a recess portion in the first dielectric layer, wherein the recess portion is located between and above the devices;
    forming a second dielectric layer to cover and directly physically contact the top surface of the first dielectric layer and a side surface and a bottom of the recess portion;
    removing a portion of the second dielectric layer to immediately expose the top surface of the first dielectric layer and a portion of the bottom of the recess portion to form a dielectric spacer on the side surface of the recess portion;
    after forming the dielectric spacer on the side surface of the recess portion, performing a second stage etching operation on the first dielectric layer through the recess portion to form a hole between the devices, wherein the hole extends from the top surface of the first dielectric layer to a bottom surface of the first dielectric layer to expose a portion of the etch stop layer;
    etching said portion of the etch stop layer exposed by the hole in the first dielectric layer until the substrate is exposed;
    removing the dielectric spacer to generate a via hole having a step-profile with a wider opening; and
    filling the via hole with a conductive material through the wider opening to form a via/contact connector.

12. The method of claim 11, wherein forming the devices comprises forming at least two gate structures.

13. The method of claim 12, wherein forming each of the gate structures comprises:
    forming a gate dielectric layer on the substrate;
    forming a gate on the gate dielectric layer; and forming a gate spacer on side walls of the gate dielectric layer and the gate.

14. The method of claim 11, wherein the first stage etching operation comprises using a dry etching method to etch the first dielectric layer.

15. The method of claim 11, wherein forming the second dielectric layer and forming the etch stop layer are performed using different materials.

16. The method of claim 11, wherein forming the second dielectric layer and forming the etch stop layer are performed using the same material.

17. The method of claim 16, wherein said portion of the etch stop layer exposed by the hole in the first dielectric layer is etched in the second stage etching operation.

18. The method of claim 11, wherein removing the portion of the second dielectric layer comprises:
    anisotropically etching the second dielectric layer.

19. The method of claim 11, wherein the second stage etching operation comprises using a dry etching method to etch the first dielectric layer.

20. The method of claim 11, wherein forming the second dielectric layer and forming the first dielectric layer are performed using different materials.

\* \* \* \* \*